(12) United States Patent
Nagaya

(10) Patent No.: US 6,784,497 B2
(45) Date of Patent: Aug. 31, 2004

(54) SEMICONDUCTOR DEVICE

(75) Inventor: Masafumi Nagaya, Miyazaki (JP)

(73) Assignee: Oki Electric Industry, Co., Ltd., Tokyo (JP)

(*) Notice: Subject to any disclaimer, the term of this patent is extended or adjusted under 35 U.S.C. 154(b) by 51 days.

(21) Appl. No.: 10/337,280

(22) Filed: Jan. 7, 2003

(65) Prior Publication Data

US 2003/0104660 A1 Jun. 5, 2003

Related U.S. Application Data

(63) Continuation of application No. 09/985,914, filed on Nov. 6, 2001, now Pat. No. 6,524,898, which is a continuation of application No. 09/527,018, filed on Mar. 16, 2000, now Pat. No. 6,376,881.

(30) Foreign Application Priority Data

Nov. 18, 1999 (JP) .............................................. 11-327835

(51) Int. Cl.[7] .............................................. H01L 23/62
(52) U.S. Cl. ........................ 257/355; 257/347; 257/350; 257/360
(58) Field of Search ........................ 257/347, 350–351, 257/355–360, 363, 369; 438/154–155, 199, 200, 381, 382

(56) References Cited

U.S. PATENT DOCUMENTS

| | | |
|---|---|---|
| 5,786,616 A | 7/1998 | Fukumoto et al. |
| 5,869,872 A | 2/1999 | Asai et al. |
| 5,903,184 A | 5/1999 | Hiraga |
| 6,074,899 A | 6/2000 | Voldman |
| 6,083,785 A * | 7/2000 | Segawa et al. ............. 438/238 |
| 6,172,403 B1 | 1/2001 | Chen |
| 6,191,455 B1 | 2/2001 | Shida |
| 6,204,537 B1 | 3/2001 | Ma |
| 6,294,834 B1 * | 9/2001 | Yeh et al. .................... 257/758 |
| 6,320,230 B1 | 11/2001 | Yu |
| 6,329,692 B1 | 12/2001 | Smith |
| 6,369,427 B1 | 4/2002 | Williamson |
| 6,476,445 B1 * | 11/2002 | Brown et al. ................ 257/347 |

FOREIGN PATENT DOCUMENTS

| | | |
|---|---|---|
| JP | 7-66370 | 3/1995 |
| JP | 8-88323 | 4/1996 |
| JP | 408181219 | 7/1996 |
| JP | 9-172144 | 6/1997 |
| JP | 9-289323 | 11/1997 |
| JP | 411261010 | 9/1999 |
| JP | 11-284128 | 10/1999 |

* cited by examiner

Primary Examiner—Craig A. Thompson
Assistant Examiner—Thanhha Pham
(74) Attorney, Agent, or Firm—Venable LLP; Michael A. Sartori; Daniel G. Vivarelli

(57) ABSTRACT

A semiconductor device according to the invention of the present application comprises a first semiconductor layer, a first insulating layer formed over the first semiconductor layer, a second semiconductor layer formed over the insulating layer, a protective element formed over the second semiconductor layer, an electrode pad, and a plurality of series-connected through holes for connecting the electrode pad and the protective element.

Thus, a surge voltage applied across a diffused resistor can be lightened and hence an oxide film placed below the diffused resistor can be prevented from destruction.

5 Claims, 2 Drawing Sheets

SEMICONDUCTOR DEVICE

This is a continuation of Application No. 09/985,914 filed Nov. 6, 2001, now U.S. Pat. No. 6,524,898, which is a continuation of application No. 09/527,018 filed March 16, 2000, now U.S. Pat. No. 6,376,881.

BACKGROUND OF THE INVENTION

1. Field of the Invention

The present invention relates to a semiconductor device.

2. Description of the Related Art

In a semiconductor integrated circuit wherein an integrated circuit is formed over a semiconductor substrate, a protective element has heretofore been provided between an electrode pad for swapping signals with an external device and an internal circuit. When a surge is externally inputted to the electrode pad, the protective element can lighten the surge so as to protect the internal circuit.

SUMMARY OF THE INVENTION

With the foregoing in view, it is therefore an object of the present invention to provide a semiconductor device suitable for application to a protective element formed in an SOI substrate and capable of preventing a breakdown in an oxide film located below a diffused resistor which constitutes the protective element.

There is provided a semiconductor device according to the present invention, for achieving the above object, which comprises a first semiconductor layer, a first insulating layer formed over the first semiconductor layer, a second semiconductor layer formed over the insulating layer, a protective element formed over the second semiconductor layer, an electrode pad, and a plurality of series-connected through holes for connecting the electrode pad and the protective element.

BRIEF DESCRIPTION OF THE DRAWINGS

While the specification concludes with claims particularly pointing out and distinctly claiming the subject matter which is regarded as the invention, it is believed that the invention, the objects and features and advantages thereof will be better understood from the following description taken in connection with the accompanying drawings in which:

DETAILED DESCRIPTION OF THE PREFERRED EMBODIMENTS

Preferred embodiment of the present invention will hereinafter be described in details with reference to the accompanying drawings.

Figure 1:
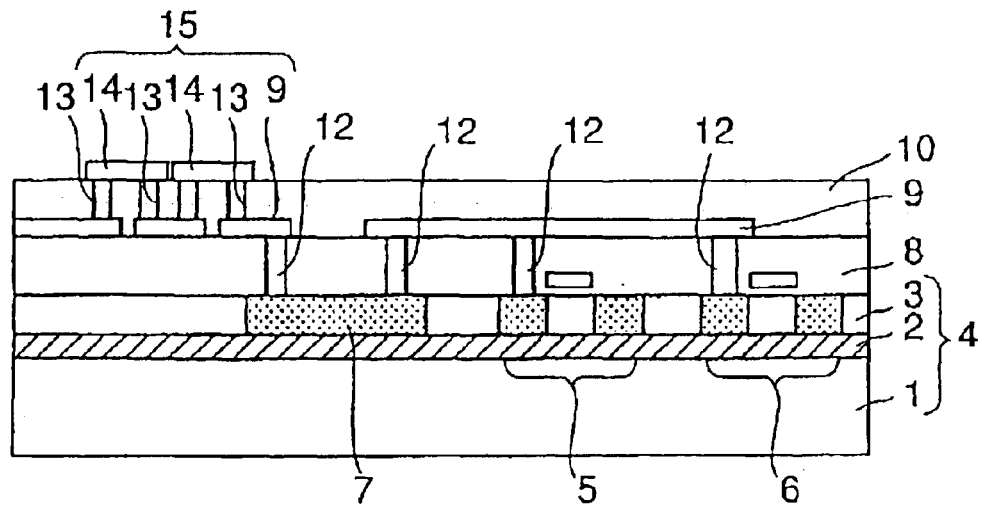
FIG. 1 is a cross-sectional view showing a first embodiment of the present invention.
Figure 2:
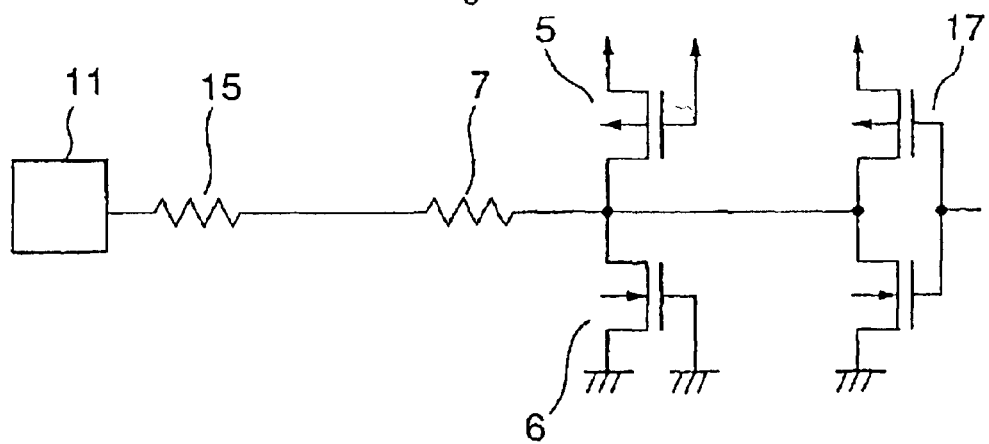
FIG. 2 is an equivalent circuit diagram showing the first embodiment of the present invention.
Figure 3:
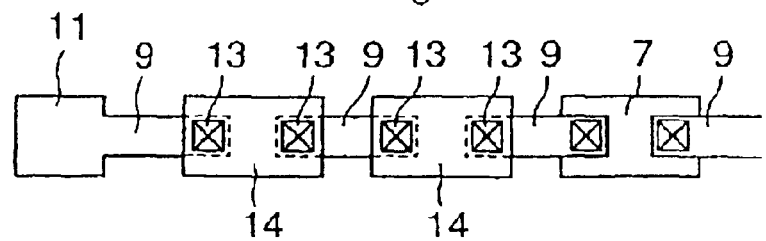
FIG. 3 is a layout view depicting resistance means employed in the first embodiment of the present invention.

FIG. 1 is a cross-sectional view of a protective element or device portion according to a first embodiment of the present invention, FIG. 2 is a circuit diagram of protective element portion, and FIG. 3 is a pattern diagram of a resistive portion, respectively.

The first embodiment of the present invention will hereinafter be explained using these drawings.

FIG. 1 shows an example in which the present invention is applied to a protective element of an output circuit part. A protective element formed in an SOT substrate 4 is disclosed herein. The SOT substrate 4 is formed as follows: An oxygen ion is first implanted in the entire surface of a silicon substrate at a predetermined depth thereof and the silicon substrate is annealed, whereby a silicon oxide layer 2 is formed at a predetermined depth. Thus, the silicon substrate is separated into a silicon substrate 1 and a silicon layer 3 by the silicon oxide layer 2 corresponding to an insulating layer.

A method of forming another SOT substrate is as follows: Two silicon substrates each having an oxide film formed thereon are prepared and the surfaces of the oxide films are bonded to each other. Thereafter, one of the silicon substrates is polished. The polished surface thereof can be also used as the silicon layer 3.

A PMOS transistor 5, an NMOS transistor 6 and a diffused resistor 7 are formed within the silicon layer 3 of the SOI substrate. P type source/drain diffused layers for the PMOS transistor 5, which are formed within the silicon layer 3, N type source/drain diffused layers for the NMOS transistor 6, which are formed within the silicon layer 3, and the diffused resistor 7 are respectively formed up to a depth at which they contact the silicon oxide layer 2.

Further, the PMOS transistor 5, the NMOS transistor 6 and the diffused resistor 7 are respectively electrically insulated from one another by an unillustrated element isolation region. As the element isolation region, for example, a thick oxide film is used which extends from the surface of the silicon layer 3 to the silicon oxide film 2.

An insulating layer 8 is formed over the silicon layer 3 in which these PMOS transistor 5, NMOS transistor 6 and diffused layer 7 are formed. Each of first layer metal interconnections 9 comprised of, for example, an aluminum alloy is formed over the insulating layer 8.

One diffused layer for the PMOS transistor and the gate of the PMOS transistor are electrically connected to the first layer metal interconnection supplied with a source potential via an unillustrated through hole defined in the insulating layer 8, whereas the other diffused layer thereof is electrically connected to one end of the diffused resistor 7 via through holes 12 defined in the insulating layer 8 and the first metal interconnection.

One diffused layer for the NMOS transistor and the gate of the NMOS transistor are electrically connected to the first layer metal interconnection supplied with a ground potential via an unillustrated through hole defined in the insulating layer 8, whereas the other diffused layer thereof is electrically connected to one end of the diffused resistor 7 via contact holes 12 defined in the insulating layer 8 and the first metal interconnection.

The other end of the diffused resistor 7 is electrically connected to one end of resistive means 15 via its corresponding through hole 12 defined in the insulating layer 8.

Second layer metal interconnections 14 each comprised of, for example, an aluminum alloy are formed over their corresponding first layer metal interconnections 9 through an interlayer dielectric 10. A plurality of through holes 13 are defined in the interlayer dielectric 10. Tungsten is embedded in the through holes. The first layer metal interconnections 9 and the second layer metal interconnections 14 are electrically connected to one another through the tungsten embedded in the through holes 13. The plurality of through holes 13 are series-connected between an electrode pad 11 and the diffused resistor 7, and their resistance values can be set according to the number of the through holes 13.

The plurality of through holes series-connected in this way have predetermined resistance values respectively. In the first embodiment, the plurality of series-connected through holes are used as the resistive means 15.

The resistance value of the resistive means is as follows: Assuming that, for example, the diameter of each through hole is defined as 0.5 μm, the height thereof is defined as 0.8 μm and a resistance value per through hole is defined as 0.8 Ω, the resistance value of the resistive means 15 results in 100 Ω when 375 stages are connected in parallel combinations of the three through holes. When the resistance value of the diffused resistor is defined as 25 Ω, a voltage applied across the diffused resistor 7, of a surge voltage inputted to the electrode pad 11 can be reduced to ⅕.

It is desirable that the resistive means 15 is set higher than the diffused resistor 7 in resistance to diffuse the surge voltage inputted from the electrode pad into the resistive means 15 and the diffused resistor 7 and sufficiently reduce the voltage applied to the diffused resistor 7 in this way.

Owing to such a construction, a surge in the surge voltage inputted to the electrode pad 11 can be absorbed by supplying electric charges to the PMOS transistor 5 and the NMOS transistor 6 while the time required for the surge to rise is being delayed by the resistive means 15, the diffused resistor 7 and the capacities of the PMOS transistor 5 and the NMOS transistor 6. Thus, an unillustrated internal circuit connected through an output buffer 17 can be protected. Further, the surge voltage applied across the diffused resistor 7 can be lowered and the oxide film 2 placed below the diffused resistor 7 can be prevented from breaking down.

The present embodiment has been described with the protective element of the output circuit as an example. However, the present invention can be applied even to an input protective element.

Figure 4:
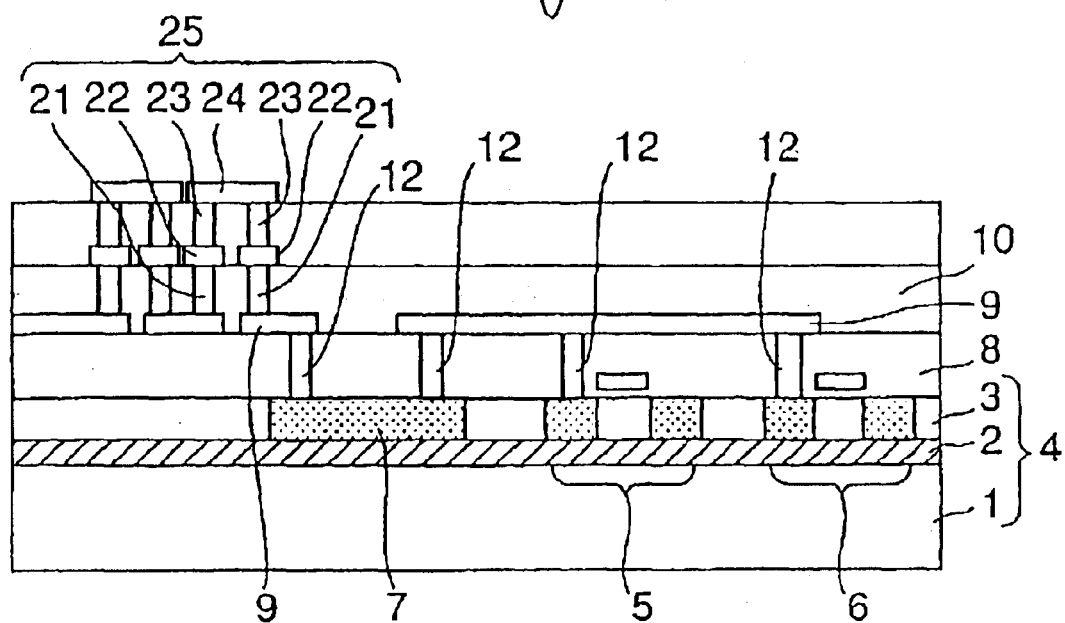
FIG. 4 is a cross-sectional view showing a second embodiment of the present invention.

A second embodiment of the present invention will next be described with reference to FIG. 4. The same elements of structures as those employed in the first embodiment are identified by the same reference numerals and the description thereof will therefore be omitted.

In the second embodiment, a through hole 21 for electrically connecting a first layer metal interconnection 9 and a second layer metal interconnection 22 and a through hole 23 for electrically connecting the second layer metal interconnection 22 and a third layer metal interconnection 24 are series-connected to each other. Further, the through hole 21 and the through hole 23 are connected in series in plural form to thereby form resistive means 25.

In a manner similar to the first embodiment even in the case of the present embodiment, the aluminum alloy is used for the first layer metal interconnections 9, second layer metal interconnections 22 and third layer metal interconnections 24, and the tungsten is used as a metal to be embedded in the through holes 21 and 23, respectively.

Owing to the use of the through holes series-connected between the first layer, second layer and third layer metal interconnections as the resistors in this way, the resistive means can be formed in a less area as compared with the first embodiment.

Figure 5:
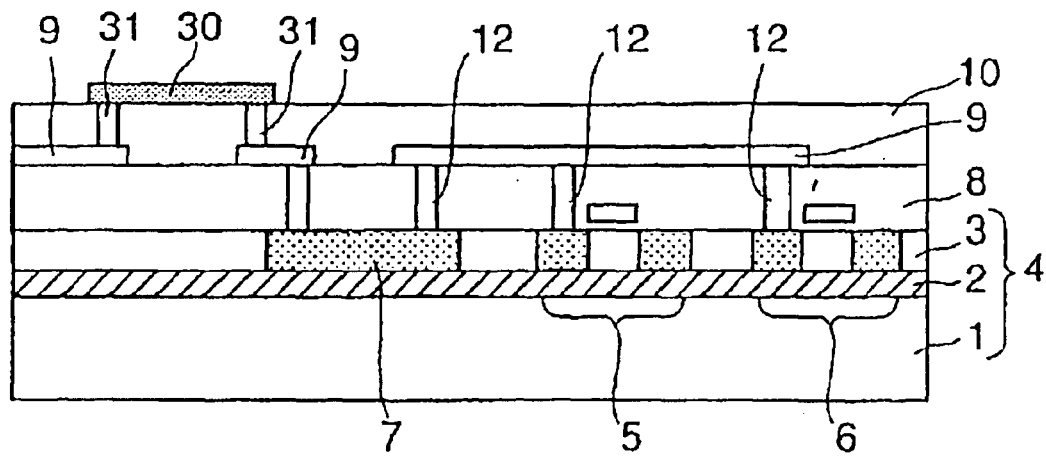
FIG. 5 is a cross-sectional view illustrating a third embodiment of the present invention.

A third embodiment of the present invention will next be explained with reference to FIG. 5. Incidentally, the same elements of structure as those employed in the first embodiment are identified by the same reference numerals and the description thereof will therefore be omitted.

In the third embodiment, a material such as polysilicon, tungsten, which has a resistance value higher than the aluminum alloy, is used as resistive means 30.

The resistive means 30 is formed over an interlayer dielectric 10, and both ends thereof are respectively electrically connected to first layer metal interconnections 9 via through holes 31. It can be expected that owing to the use of the high-resistance poly-silicon or tungsten as the resistive means in this way, the equivalent resistance value can be obtained in a less area as compared with the resistive means 15 formed by using the through holes 13 in the first embodiment.

While the third embodiment has been described by the example in which the resistive means 30 is formed over the interlayer dielectric 10 formed over the first layer metal interconnections 9, the resistive means 30 can be also formed by using a wiring layer such as poly-silicon when the wiring layer such as the poly-silicon is formed below each first layer metal interconnection 9.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device comprising:
   a silicon-on-insulator (SOI) substrate which includes a first insulating layer and a silicon layer on the first insulating layer;
   a first resistive element formed in the silicon layer and in contact with the first insulating layer;
   a first transistor of a first conductivity type formed in the silicon layer, wherein the first transistor includes a first diffused region which connects to a first power source and a second diffused region which connects to one end of the first resistive element, wherein a bottom of the first and second diffused regions are in contact with the first insulating layer;
   a second transistor of a second conductivity type formed in the silicon layer, wherein the second transistor includes a third diffused region which connects to a second power source and a fourth diffused region which connects to the one end of the first resistive element, wherein a bottom of the third and fourth diffused regions are in contact with the first insulating layer;
   a second insulating layer formed on the substrate and covering the first and second transistors;
   a second resistive element formed on the second insulating layer, wherein one end of the second resistive element is connected to the other end of the first resistive element; and
   an electrode pad formed on the second insulating layer and connected to the other end of the second resistive element.

2. A semiconductor device according to claim 1, wherein second resistive element includes a plurality of series connected through holes.

3. A semiconductor device according to claim 1, wherein second resistive elements includes a polycrystalline silicon or tungsten.

4. A semiconductor device according to claim 1, further comprising a third insulating layer formed on the second insulating layer, wherein second resistive element includes a plurality of series connected through holes each of which is formed in the third insulating layer.

5. A semiconductor device according to claim 1, further comprising a third insulating layer formed on the second insulating layer and a fourth insulating layer formed on the third insulating layer, wherein second resistive element includes a first plurality of through holes formed in the third insulating layer and a second plurality of through holes formed in the fourth insulating layer, wherein the first plurality of through holes and the second plurality of through holes are connected in series.

* * * * *